United States Patent [19]

Sourgen et al.

[11] Patent Number: 5,781,470
[45] Date of Patent: Jul. 14, 1998

[54] PROTECTED WRITING METHOD FOR AN INTEGRATED MEMORY CIRCUIT AND A CORRESPONDING INTEGRATED CIRCUIT

[75] Inventors: Laurent Sourgen, Aix-en-Provence; Sylvie Wuidart, Pourrieres, both of France

[73] Assignee: SGS-Thomson Microelectronics, S.A., France

[21] Appl. No.: 621,185

[22] Filed: Mar. 21, 1996

Related U.S. Application Data

[60] Provisional application No. 60/007,724, Nov. 30, 1995.

[30] Foreign Application Priority Data

Mar. 21, 1995 [FR] France .................... 95 03294

[51] Int. Cl.[6] .................... G11C 11/34
[52] U.S. Cl. .................... 365/185.04; 365/185.19
[58] Field of Search .................... 365/185.04, 185.19

[56] References Cited

U.S. PATENT DOCUMENTS 4,434,478 2/1984 Cook et al. .................... 365/185.18
5,046,046 9/1991 Sweha et al. .................... 365/185.04
5,206,905 4/1993 Lee et al. .................... 380/4
5,287,469 2/1994 Tsuboi .................... 395/430

FOREIGN PATENT DOCUMENTS 0368727 5/1990 European Pat. Off. .

Primary Examiner—David C. Nelms
Assistant Examiner—Hoai V. Ho
Attorney, Agent, or Firm—Michael J. Buchenhorner; Gunster, Yoakley, Valdes-Fauli & Stewart

[57] ABSTRACT

The present invention concerns a method for protecting a write operation of a memory cell within an integrated circuit that comprises the introduction of a random period (d1) between the reception of an external write command and the application of a physical variable to the memory cell so as to thwart the determination of the applied waveform characteristics as a function of time of this physical variable. The present invention also concerns an integrated circuit that comprises a memory whose write operation is protected according to this method. An application of the present invention is in the domain of chip carrying cards, i.e. smartcard applications.

20 Claims, 2 Drawing Sheets

PROTECTED WRITING METHOD FOR AN INTEGRATED MEMORY CIRCUIT AND A CORRESPONDING INTEGRATED CIRCUIT

CROSS-REFERENCE TO RELATED APPLICATION

This application is a provisional Application No. 60/007,724, filed on Nov. 30, 1995.

BACKGROUND AND SUMMARY OF THE INVENTION

The present invention concerns a method for improving the protection of write operations in an integrated memory circuit. It also concerns an integrated circuit that carries out such a method.

The present invention is particularly applicable to integrated circuits that are used in chip carrying card applications, i.e. smartcard applications, especially where information is written during the use of the card. Some examples of the types of smartcard available include prepaid 'throw away' cards, i.e. telephone cards, prepaid rechargeable cards and bank cards. In such cards, information is written (by a card reader) so that the card can have its stored data updated each time it is used. (Some of the history of work in this area is shown by U.S. Pat. Nos. 3,906,460; 3,934,122; 4,001,550, 4,007,355, 4,105,156, 4,197,986, 4,499,556; 4,612,413; 4,816,653; 4,816,654; 4,855,690; 4,882,474; 4,890,263; 4,943,804; 4,985,921; 5,010,331; 5,093,862; 5,120,939; and 5,146,499; Hill, "Smart cards: The next generation," 29 Telecommunications (International Edition) no.9, p.73–4, 76 (September 1994); Ferreira, "Smart cards get smarter: the Philips intersector electronic purse system," 52 PHILIPS TELECOMMUNICATION REVIEW 52–5 (August 1994); the proceedings of the first through eighth annual ESCAT conferences; and references cited therein; all of which are hereby incorporated by reference.)

It is essential that the write operation cannot be disturbed or interrogated by whatever means. This imperative can be well understood with respect to bank card applications: for example, a situation must not be allowed such that the write operation is in any way altered so that the value of the stored data is credited instead of being debited.

The write operation consists of subjecting memory cells to a physical variable that has a magnitude that is capable of provoking a change in the states of these cells: for example, the physical variable can be magnetic or electric or other variables depending upon the technology used to implement the memory. For the purposes of the following text, it shall be assumed that the physical variable is a voltage, which creates an electric field, that is sufficient to cause a change in the states of the cells. This assumption is intended to be non-limiting.

For example, the write operation in a non-volatile memory includes the step of applying a high writing voltage, that is substantially greater than the logic supply voltage of the memory, to at least one terminal of a memory cell, according to the technology used to implement the memory.

In particular, the programming of an E$^2$PROM memory cell necessitates the application of a high writing voltage between the gate and the drain terminals of the cell so as to obtain the Fowler Nordheim effect of migration of electric charge towards the floating gate terminal of the cell.

In the present invention, it has been discovered that it was possible to disturb and alter the contents of a memory in a particular manner during a period of the write operation.

In fact, a precise period was discovered during the write cycle, where the state of the memory cell changes. For an electrically modifiable cell, for example an E$^2$PROM memory cell, it is the moment where the physical phenomena of the migration of the electric charge is produced with its greatest intensity. This period is always short with respect to the total duration of the write cycle, which is the case for all types of modifiable memories.

It has thus been discovered that by disturbing, by one means or another, the physical variable involved in the write operation during this short period, it is possible to substantially modify or alter the contents of a memory cell. In this case the reading of a '0' or a '1' would become uncertain, while the security sensors usually used to control the normal external functioning conditions of the circuit would not have detected any anomaly.

It is therefore possible that an advised unauthorized person may be able to determine the critical period of the application of the physical variable, that is used for writing the memory. During such a critical period, an abrupt and momentary variation of the physical variable would result in a substantial modification of the contents of the memory cell.

An object of the present invention is to render impossible the determination of such a critical period.

Such as claimed, the present invention concerns a method for improving the protection of a write operation in an integrated memory circuit, a write operation in a memory cell comprising the application of a physical variable that is capable of provoking a change in the state of the cell.

According to the present invention, the method consists of introducing a random period between the reception, by the integrated circuit, of an external write command and the internal application of this physical variable to the memory.

In this way, it no longer becomes possible to determine the characteristics of the applied physical variable as a function of time, which thus thwarts the determination of the particular critical period as described above.

In order to improve the protection of the write operation, it is provided that the period between the reception of a write command and the sending of a signal that indicates the end of execution of the write operation is kept constant.

In a variation, this constant period is re-programmable.

According to another characteristic of the present invention, the random period is down-counted by a counter.

For an integrated circuit having an associated microprocessor, an improvement of the method of the present invention can be obtained in that the random value is down-counted partly by the microprocessor and partly by the counter.

The present invention also concerns an integrated circuit that includes an integrated memory circuit that is modifiable by the application of a writing physical variable.

According to the present invention, the integrated circuit includes a pseudo-random generator that supplies each write command to said memory with a random value and at least one element that is capable of down-counting this value so as to delay in a random manner the application of said physical variable.

BRIEF DESCRIPTION OF THE DRAWING

The disclosed inventions will be described with reference to the accompanying drawings, which show important sample embodiments of the invention and which are incorporated in the specification hereof by reference, wherein.

Other characteristics and advantages of the present invention will become apparent from the following detailed description that is intended to be non-limiting with reference to the attached diagrams in which.

DETAILED DESCRIPTION OF THE PREFERRED EMBODIMENTS

The numerous innovative teachings of the present application will be described with particular reference to the presently preferred embodiment (by way of example, and not of limitation), in which:

The present invention concerns memories whose contents are modifiable by the application of an electric variable. It has been seen that a person skilled in the art is able to determine the critical period of the application to memory cells of the electric variable, during which the state of these memory cells changes. This critical period is always short in comparison to the duration of the write cycle, whatever the technology used to implement the memory.

In the particular case of an electrically modifiable memory, the physical variable that is applied to the memory is a voltage pulse signal.

Figure 1A:
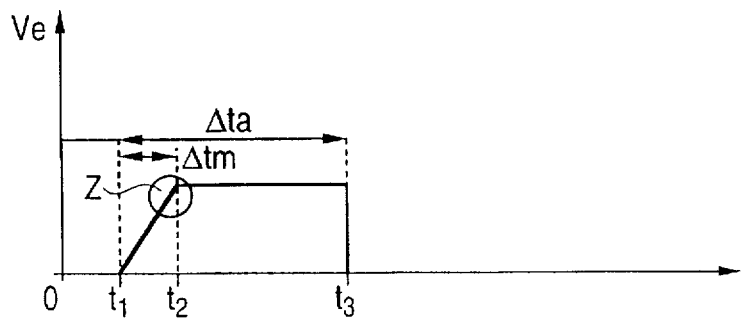
FIG. 1a represents a prior art voltage signal Ve that is applied to electrically modifiable memory cells during a write operation according to prior art.

FIG. 1a represents a typical state of the art waveform of a write voltage pulse signal Ve, as a function of time, that is applied to the cells of an electrically modifiable memory during a write cycle.

Figure 1B:
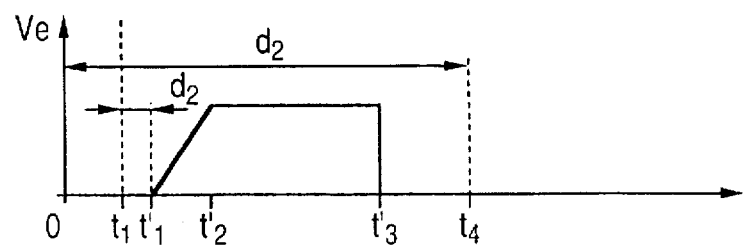
FIG. 1b represents a voltage signal Ve that is applied to electrically modifiable memory cells during a write operation according to the present invention.

FIG. 1b represents a waveform of a write voltage pulse signal Ve, as a function of time, that is applied to the cells of an electrically modifiable memory during a write cycle according to the present invention.

In both FIGS. 1a and 1b the write cycle begins at the moment a write command has been received, which has been denoted by the reference 0. Signals having similar characteristics are obtained for all other types of modifiable integrated circuit memories.

When, in prior art illustrated in FIG. 1a, an external write command for an electrically modifiable memory is received by a microprocessor µP (illustrated in FIG. 2) or a control unit 13 (illustrated in FIG. 3), a time t1 elapses. This time t1 corresponds to the taking in account and decoding time required by the microprocessor or the control unit to control the application of the write voltage pulse signal Ve to the decoder of the memory.

The write pulse signal is itself characterized by a rise time $\Delta tm=t2-t1$ and an application time duration $\Delta ta=t3-t1$. The application time is a function of the technology used to implement the memory: EPROM, E²PROM or others and of the information to be written (0 or 1). The rise time of the write pulse signal is voluntarily controlled so as to limit the stress upon the memory cells.

Figure 2:
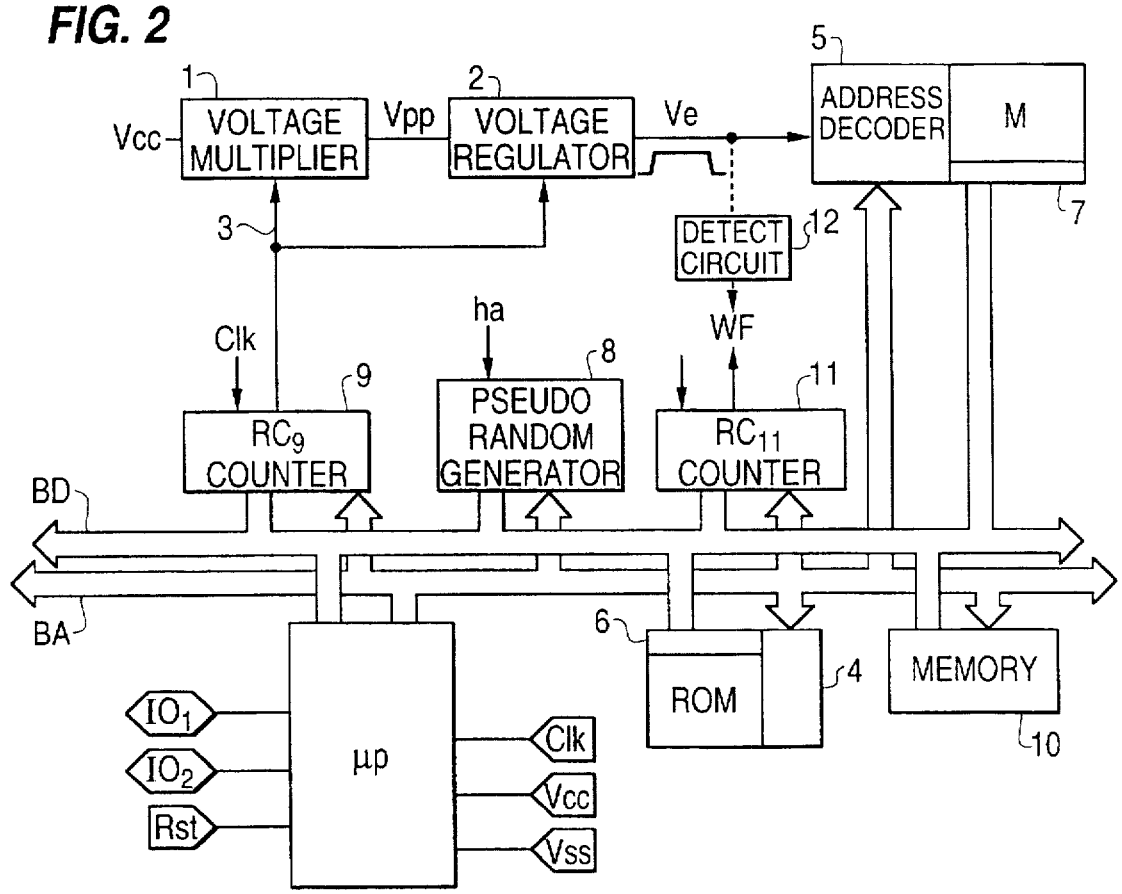
FIG. 2 illustrates a general schematic diagram of an integrated circuit having an associated non-volatile electrically modifiable memory that includes circuitry for carrying out the method according to the present invention.

The write pulse signal may be derived from a high voltage that is generated internally within the memory circuit. The integrated circuit thus comprises a generator for providing a high voltage Vpp from the logic supply voltage Vcc of the integrated circuit. The generator includes, as illustrated in FIG. 2, a voltage multiplier 1 that provides the high voltage Vpp and a voltage regulator 2 which delivers a write voltage signal Ve that has the required characteristics ($\Delta tm$, $\Delta ta$).

Figure 3:
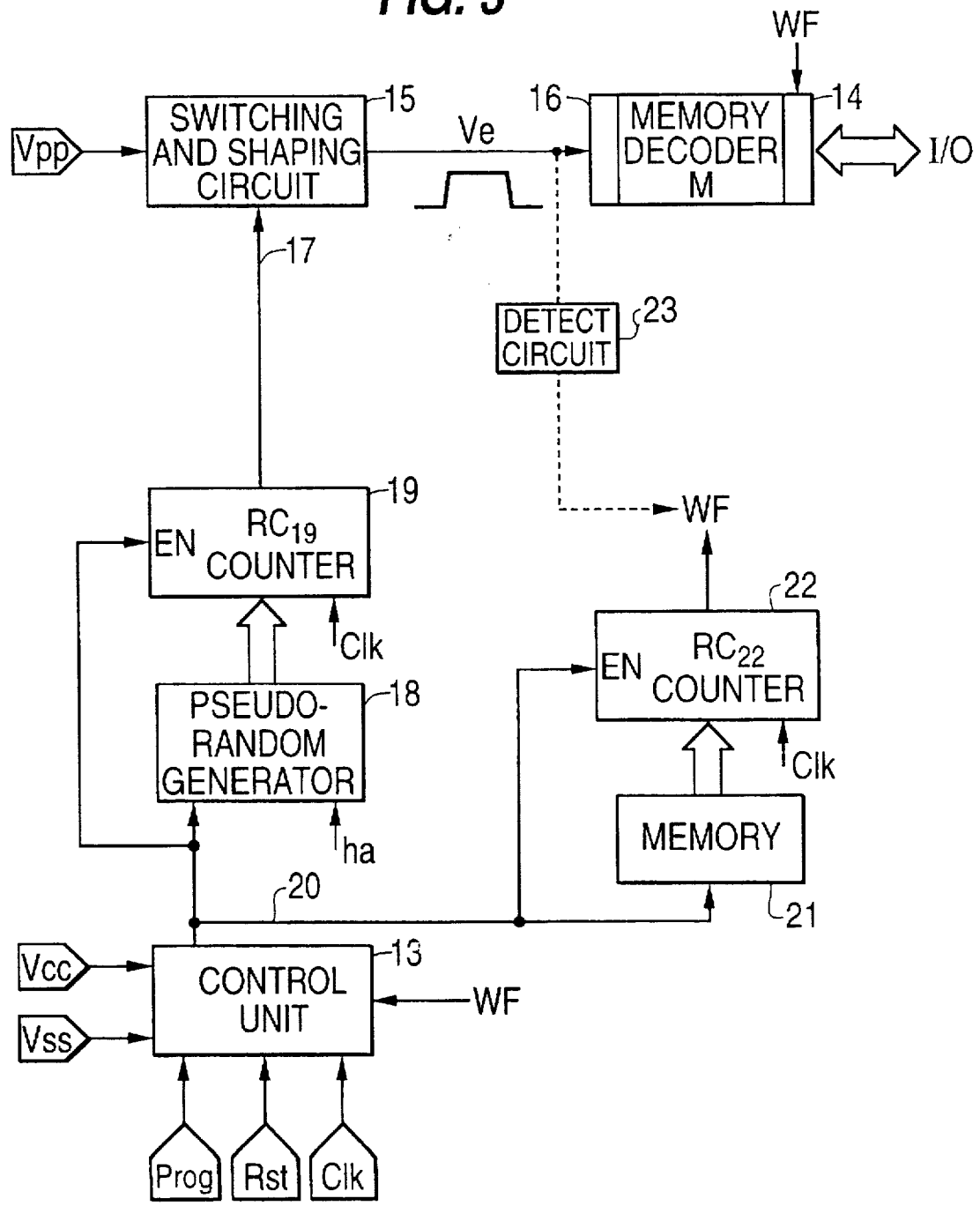
FIG. 3 illustrates another general schematic diagram of an integrated circuit having an associated non-volatile electrically modifiable memory that includes circuitry for carrying out the method according to the present invention.

In certain cases the high voltage is supplied to the integrated circuit via a supply terminal Vpp (as illustrated in FIG. 3). In this case the integrated circuit comprises a switching and shaping circuit 15 for applying a write pulse signal that has the required characteristics ($\Delta tm$, $\Delta ta$) to the memory decoder.

But, whatever the means used to generate and apply the write pulse signal, its waveform, as a function of time, will be as illustrated in FIG. 1a. In more general terms, the waveform of the application of the physical variable is always the same from one write command to another: it corresponds to physical characteristics of the integrated circuit. Knowledge of the characteristics of the waveform of FIG. 1a will allow an informed criminal to identify the precise critical period Z of the application of the write signal to the memory cells. At such a period Z, a variation of any one of the functional parameters of the circuit (i.e. voltage, temperature, frequency etc.;) may cause a substantial modification of the states of the cells that are subjected to the write pulse signal.

An aim of the invention is to prevent the critical period Z to be identified so that any fraud can never occur.

According to the present invention, when an external write command is received, a random duration or period is introduced between the reception of the write command and the application of the write pulse signal to the memory. In the example represented in FIG. 1b, a random duration d1 has been introduced between the write command once it has been taken in account, which is at time t1, and the application of the write pulse signal, which starts to be applied, from its minimum level, at time t1'. Therefore, it can be seen that this random duration equals $d1=t1'-t1$.

The specific characteristics of $\Delta ta$ and $\Delta tm$ of the write pulse signal remain unchanged. If t2' is the time at the end of which the write pulse signal reaches its maximum level and t3' is the time where the write signal ends (negative transition in the example) then:

$$t3'-t1'=\Delta ta;$$

and $$t2'-t1'=\Delta tm.$$

In order for the random duration d1 to be effective it must have a duration width sufficiently large with respect to the duration of the critical period Z. However, this duration must not be chosen such that it is too large with respect to the duration of the period $\Delta ta$ of the write signal, to avoid slowing down too much the write operation.

As illustrated in FIG. 1b, the write operation is terminated when there is a transition of the write signal from its maximum to its minimum level, that is at time $t3'=t1+d1+\Delta ta$.

In order to provide the best security for the mode of protection according to the present invention, it is preferable to have a total constant duration d2 between the reception of a write command and the sending or transmitting of a signal that indicates the end of execution of the write command. Such a constant duration d2 thus masks the random aspect according to the present invention. In such a case, the signal indicating the end of execution of the write command no longer corresponds to the transition of the write signal from its maximum to its minimum level, but to a supplementary delay that is equal to d2−t1−Δta, which is referenced from the reception of the external write command, i.e. 0. It can thus be seen that the signal illustrated in FIG. 1a is also present in FIG. 1b but with a random position within a time-frame of duration d2.

What is important in practice is the choice of a random delay d1 which is large with respect to the duration of the critical period Z. And also that the increase in total time required for the write operation remains small with respect to the minimum obligatory duration required for the write operation, which is equal to the time necessary for processing and decoding the external write command (t1), added to the duration of the write pulse signal (Δta).

With the method according to the present invention, it is made impossible, or at least very difficult, to determine the critical period Z where the write operation in a memory is particularly sensitive to its functional parameters.

FIG. 2 represents an example of an application of an integrated circuit that includes a non-volatile electrically modifiable type of memory and that further includes on-chip circuitry for generating the write pulse signal.

In this example, the integrated circuit includes a microprocessor μP, a Read Only Memory (ROM) and a non-volatile Read/Write memory M. These different elements (that are non-exhaustive) are all connected to an address bus BA and a data bus BD which are controlled by the microprocessor. More particularly, the address bus arrives at the decoder 4 of the ROM memory and at the decoder 5 of the non-volatile memory M. The data bus is applied to an input stage 6 of the ROM memory (only readable) and an input/output stage 7 of the non-volatile memory M (writable and readable).

The microprocessor also receives external interface signals, in this example: the logic supply voltages Vcc and Vss; a clock signal Clk; a reinitialization signal for the integrated circuit Rst; and two serial input/output data signals $IO_1$ and $IO_2$.

The integrated circuit also includes an internal voltage generator circuit that generates a high voltage Vpp that is necessary for writing data into the non-volatile memory. Such a high voltage generator circuit is known to those skilled in the art. In a basic representation the high voltage generator circuit includes a voltage multiplier 1, i.e. a charge pump, that provides a high voltage Vpp and a regulation circuit 2 that provides a write pulse signal Ve that has a duration of Δta and a rise time of Δtm. The charge pump 1 and the regulator 2 are activated upon reception of a control signal 3. In the following text, one speak of a write pulse signal generator circuit.

The write pulse signal Ve is applied to the cells of the non-volatile memory M by the address decoder 5.

According to the method of the present invention, a random duration d1 is used in order to delay the activation of the control signal 3 for the write pulse signal generator circuit.

In a first example of carrying out the procedure according to the present invention, the integrated circuit includes a pseudo-random generator 8 for initializing a counter 9. The counter 9 has an output $RC_9$ that is used to deliver the control signal 3 for the write pulse signal generator circuit.

In practice, the output $RC_9$ represents the carry of the counter. The clock signal Clk is applied to the counter 9. A clock signal ha, that is generated within the integrated circuit, is applied to the pseudo-random generator 8. Preferably, this clock signal ha is astable.

When the microprocessor receives, from input/output signals $IO_1$ and $IO_2$, an instruction to write to the non-volatile memory and has decoded this write instruction at t1, it reads from the pseudo-random generator 8 a random value so as to initialize and activate the counter 9. The random value is down-counted at the clock signal Clk rate. When the contents of the counter 9 reaches 1, the corresponding output $RC_9$ activates the write pulse signal generator circuit (1 and 2).

In order to carry out a preferred method of the present invention according to which a write cycle keeps a constant duration d2, the integrated circuit further includes a memory element 10 to store data relative to the constant duration d2 and another counter 11.

When the microprocessor has decoded an external write instruction of the non-volatile memory, received from input/output signals $IO_1$ and $IO_2$, at the end of time period t1, it will then read the memory element 10 so as to initialize and activate the counter 11. The representative value of the constant duration d2 is down-counted in this counter at the clock Clk rate. When the carry of counter 11 changes to 1, the corresponding output $RC_{11}$ is used to transmit a signal WF that indicates the end of execution of the write cycle. This signal WF is in particular transmitted to the microprocessor which may then transmit an end of execution message towards the input/output signals $IO_1$ and $IO_2$.

Other modes of operation are also possible. For example, it is possible to initialize the counter 11 upon the detection of the negative transition of the write pulse signal with a value calculated for each write cycle by subtracting from the constant duration d2 the random duration d1 (t1'−t1) that is down-counted and the durations t1 and Δta.

In practice, the memory element 10 may be an element within the ROM memory or a battery of fuses. It is preferably programmable only once. However, for certain applications the memory element 10 might be re-programmable under the condition that means for securing access to it are provided with. For example, it is possible in the case of a prepaid rechargeable card that the duration d2 is modified each time the card is recharged with units.

In order to improve the protection, it is also possible that this duration d2 has a reference value for a given circuit and may vary from one circuit to another in a range of possible values.

In the case where a constant duration d2 is not imposed during a write cycle, the signal WF indicating the end of execution of the write cycle is transmitted in a normal manner by a circuit 12 that detects the negative transition of the write signal. The circuit 12 is illustrated by the dashed line in FIG. 2.

Other variations of functionality (not illustrated) are possible, notably by using counting loops within the microprocessor in combination or not with the counters 9 and/or 11 (variations of structures).

In a first variation, the counters 9 and 11 are not required. The pseudo-random generator 8 is used by the microprocessor in order to initialize a random counting loop 8. The memory element 10 is used by the microprocessor in order to initialize a counting loop that has a value that is representative of the duration d2, if the constant duration option is chosen.

In another variation, the counters 9 and 11 are used as discussed above. However, in this case the taking in account and the decoding of the external write command by the microprocessor are artificially and randomly delayed. For this, before initializing the counter 9 the microprocessor reads the pseudo-random generator 8 so as to initialize a software count loop. In this way it is possible to obtain a first random duration that is down-counted by the microprocessor itself; a second duration is then down-counted by the counter 9. In such a case optimum protection is obtained. It is possible to interrogate the pseudo-random generator twice, firstly to initialize the count loop and secondly to initialize the counter. Therefore, the generator should be dimensioned such that the sum of the two random durations does not exceed the maximum duration. It is also possible to interrogate the pseudo-random generator only once, the microprocessor then deducing a value for the count loop and a value for the counter 9. In fact, it is as if the random duration d1, illustrated in FIG. 1b, is partly down-counted by the microprocessor itself (that is to say a software down-count) and partly down-counted by a counter (that is to say a hardware element).

In the example shown, the elements 8, 9, 10 and 11 that serve to carry out the method according to the present invention are all connected to the address bus and data bus of the integrated circuit. According to the chosen functional variation, it is possible that the counter 9 or 11 is accessible only by the element that initializes it (the pseudo-random generator 8 or the memory element 10).

FIG. 3 illustrates another example of an integrated circuit application of the method according to the present invention. In this example, the high voltage Vpp originates from an external source and is supplied to the integrated circuit via an input terminal. It should be noted that for the elements of FIG. 2 that have non-numeric references and that are found in FIG. 3 the same references have been adopted.

The integrated circuit includes a control circuit 13 of the type that sequences instructions. This control circuit 13 comprises a decoder for decoding the control signals and an address counter for addressing the non-volatile memory M. The input/output stage 14 of the non-volatile memory is connected to a serial data input/output port I/O.

The control signals received by the control circuit 13 are generally the integrated circuit's re-initialization signal Rst, clock signal Clk and a write control signal Prog.

The integrated circuit also receives a logic supply voltage Vcc and its associated ground potential Vss that are in particular applied to the control circuit 13 and receives the high voltage supply Vpp which is necessary for writing to the non-volatile memory.

This high voltage supply Vpp is applied to a switching circuit 15 to reshape this high voltage Vpp in a write pulse signal Ve with Δtm and Δta characteristics and to switch signal Ve to the memory decoder 16. This switching circuit 15 is activated upon reception of a control signal 17.

In order to carry out the method of the present invention, wherein this control signal 17 is delayed by a random duration d1 after the taking in account of an external write command, the integrated circuit comprises a pseudo-random generator 18 that is coupled to a counter 19. An output $RC_{19}$ of the counter 19, the carry of the counter in the example, is used as the control signal 17 of the switching circuit 15. The clock signal Clk is applied to the counter 19. An internally generated clock signal ha is applied to the pseudo-random generator 18. This clock signal ha is preferably stable.

When the control circuit 13 has taken in account and decoded an external write command for the non-volatile memory (at the end of the duration t1) it activates (control signal 20 in FIG. 3) the pseudo-random generator 18 and the counter 19 to initialize the counter 19 with a value output by the pseudo-random generator. This value is down-counted at the clock signal Clk rate. When the contents of the counter 19 reaches 1, the corresponding output $RC_{19}$ activates switching circuit 15.

In order to carry out the method of the present invention, wherein a write operation keeps a constant duration d2, the integrated circuit further includes a memory element 21 that contains information corresponding to the duration d2 that is determined for said integrated circuit, and a counter 22 whose output $RC_{22}$ is used as the signal WF which indicates the end of execution of the write cycle (in the example, $RC_{22}$ is the carry of the counter). The control signal 20 thus serves to initialize the counter 22 with the information stored in the memory element 21 and to validate the down-counting that takes place at the clock signal Clk rate. The signal WF is applied to the control circuit and to the input/output stage 14 of the memory (in order to put the input/output stage into a high impedance state).

In practice, memory element 21 may be an element of the ROM memory or a battery of fuses, as described above for the memory element 10 of FIG. 2. As was described on this occasion, it is possible that it may be programmed only once, or be re-programmable if access is secured.

If a constant duration d2 for the write cycle is not implemented, the signal WF, which indicates the end of execution of the write cycle, is supplied in the usual manner, i.e. by a circuit 22 that detects the negative transition, as indicated by the dashed line in FIG. 3.

In the above two detailed examples of an integrated circuit, a serial data access mode has been illustrated. This choice does not influence how the method according to the present invention is carried out and can be applied equally well to other integrated circuits that have parallel data access and all types of modifiable memory.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A method for operating a portable data module which includes a programmable non-volatile memory, comprising the steps of:
   (a.) when programming of said memory is commanded, then imposing a random delay before beginning to ramp up the programming voltage; and
   (b.) terminating the programming of said memory after a duration which is independent of the random delay of step (a.);
   whereby criminals are prevented from readily detecting the random delay of step (a.).

2. A method for protecting a write operation in an integrated circuit memory, the write operation of a memory cell comprising the application of a physical variable that provokes a change in the state of the cell, characterized in that it consists of introducing a random period between the reception by the integrated circuit of an external write command and the application of said physical variable.

3. A method according to claim 2, characterized in that the period between the reception of the external write command and the transmission of a signal indicating the end of execution of the write operation has a constant determined value.

4. A method according to claim 3, characterized in that the constant value is determined for each circuit and programmed in a memory element.

5. A method according to claim 4, characterized in that the constant value is re-programmable.

6. A method according to claim 2, characterized in that it consists of down-counting the random period by a counter.

7. A method according to claim 2, for the integrated circuit with a microprocessor, characterized in that it consists of down-counting the random period by said microprocessor.

8. A method according to claim 2, for the integrated circuit with a microprocessor, characterized in that, for each external write command, a pseudo-random generator supplies a random value to be down-counted partly by said microprocessor and partly by a counter.

9. A method according to claim 2, for the integrated circuit with a microprocessor, characterized in that for each external write command, a pseudo-random generator supplies a first random value to be down-counted by said microprocessor and a second random value to be down-counted by a counter.

10. An integrated circuit comprising a memory that can be modified by the application of a physical variable, characterized in that it comprises a pseudo-random generator for supplying a random value for each write command of said memory and at least one element capable of down-counting this value in order to delay in a random manner the application of said physical variable.

11. The integrated circuit according to claim 10, characterized in that it comprises a counter for down-counting said random value.

12. The integrated circuit including a microprocessor according to claim 10, characterized in that said microprocessor initializes a count loop for down-counting said random value.

13. The integrated circuit including a microprocessor according to claim 10, characterized in that it comprises a counter and in that said random value is down-counted partly by the microprocessor in a count loop and partly by the counter.

14. The integrated circuit including a microprocessor according to claim 10, characterized in that it comprises a counter and in that the pseudo-random generator supplies a first value that is down-counted by the microprocessor in a count loop and a second value that is down-counted by the counter.

15. The integrated circuit according to claim 10, characterized in that it comprises a memory element that contains a value that is representative of a constant period for the execution of the write command.

16. The integrated circuit including a microprocessor according to claim 15, characterized in that said constant value is down-counted by the microprocessor in a count loop.

17. The integrated circuit according to claim 15, characterized in that it comprises a counter for down-counting said constant value.

18. The integrated circuit according to claim 15, characterized in that the memory element of said constant value is re-programmable.

19. The integrated circuit according to claim 10, characterized in that the memory is a non-volatile electrically modifiable type of memory.

20. The chip carrying card, characterized in that it comprises the integrated circuit according to claim 10.

* * * * *